(12) United States Patent
Shinoda et al.

(10) Patent No.: US 9,939,918 B2
(45) Date of Patent: Apr. 10, 2018

(54) TOUCH-SENSITIVE INPUT DEVICE

(71) Applicant: HOSIDEN CORPORATION, Yao-shi, Osaka (JP)

(72) Inventors: Koji Shinoda, Yao (JP); Takeshi Isoda, Yao (JP)

(73) Assignee: HOSIDEN CORPORATION, Yao-shi (JP)

(*) Notice: Subject to any disclaimer, the term of this patent is extended or adjusted under 35 U.S.C. 154(b) by 204 days.

(21) Appl. No.: 13/760,322

(22) Filed: Feb. 6, 2013

(65) Prior Publication Data
US 2013/0207669 A1    Aug. 15, 2013

(30) Foreign Application Priority Data

Feb. 10, 2012  (JP) ................................ 2012-027107

(51) Int. Cl.
| | |
|---|---|
| G06F 3/00 | (2006.01) |
| G06F 3/02 | (2006.01) |
| H03K 17/96 | (2006.01) |
| G06F 3/044 | (2006.01) |
| G06F 3/0354 | (2013.01) |

(52) U.S. Cl.
CPC ........ *G06F 3/0202* (2013.01); *G06F 3/03547* (2013.01); *G06F 3/044* (2013.01); *H03K 17/962* (2013.01); *H03K 2217/960755* (2013.01)

(58) Field of Classification Search
CPC .............................. B32B 17/06; G06F 3/0202
USPC ....................................................... 324/609
See application file for complete search history.

(56) References Cited

U.S. PATENT DOCUMENTS

| | | | | |
|---|---|---|---|---|
| 2006/0075831 | A1* | 4/2006 | Okuda | G01L 1/146 73/862.046 |
| 2006/0164230 | A1* | 7/2006 | DeWind et al. | 340/461 |
| 2008/0143683 | A1* | 6/2008 | Hotelling | G06F 3/0416 345/173 |
| 2009/0108985 | A1 | 4/2009 | Haag et al. | |
| 2009/0219260 | A1* | 9/2009 | Bick | G06F 3/041 345/173 |
| 2010/0055967 | A1* | 3/2010 | Klinger | H01R 13/6315 439/374 |

(Continued)

FOREIGN PATENT DOCUMENTS

| | | |
|---|---|---|
| CN | 101765824 A | 6/2010 |
| EP | 2 154 596 A1 | 2/2010 |

(Continued)

OTHER PUBLICATIONS

Extended European Search Report dated Jun. 5, 2013, in counterpart European Application No. 13250015.8.

(Continued)

*Primary Examiner* — Jeff Natalini
(74) *Attorney, Agent, or Firm* — Kratz, Quintos & Hanson, LLP

(57) ABSTRACT

An input device including a base, a plastic part provided on the base, and a touch sensor embedded in the plastic part. Embedding the touch sensor in the plastic part contributes to the reduction of the distance from an outer face of the base to the touch sensor, thereby improving the sensitivity of the touch sensor. Embedding the touch sensor in the plastic part also makes it possible to omit a step of fixing the touch sensor to the plastic part, thereby improving the yield rate of the input device.

27 Claims, 7 Drawing Sheets

(56) References Cited

U.S. PATENT DOCUMENTS

| | | | |
|---|---|---|---|
| 2010/0201649 A1 | 8/2010 | Kai et al. | |
| 2010/0271328 A1* | 10/2010 | Sekiguchi | G06F 3/044 345/174 |
| 2011/0012623 A1* | 1/2011 | Gastel et al. | 324/686 |
| 2011/0133998 A1* | 6/2011 | Hobson et al. | 343/702 |
| 2011/0193818 A1* | 8/2011 | Chen et al. | 345/174 |
| 2011/0241704 A1* | 10/2011 | Laflamme et al. | 324/663 |
| 2011/0255000 A1* | 10/2011 | Weber et al. | 348/374 |
| 2011/0255850 A1* | 10/2011 | Dinh et al. | 396/176 |
| 2012/0135247 A1* | 5/2012 | Lee et al. | 428/426 |
| 2012/0307461 A1* | 12/2012 | Liskow | H05K 3/281 361/749 |
| 2013/0076573 A1* | 3/2013 | Rappoport | H01Q 1/243 343/702 |

FOREIGN PATENT DOCUMENTS

| | | |
|---|---|---|
| EP | 2 275 243 A1 | 1/2011 |
| JP | 2006-281601 A1 | 10/2006 |
| JP | 2009-087311 A | 4/2009 |
| JP | 2009-238661 A1 | 10/2009 |
| JP | 2011-007830 | 1/2011 |
| JP | 2011-013761 | 1/2011 |
| JP | 2011-243224 | 12/2011 |
| JP | 2012-28564 A | 2/2012 |
| WO | 2010/150781 | 12/2010 |

OTHER PUBLICATIONS

Decisions of Refusal dated Jan. 28, 2014 from the Japanese Patent Office in counterpart application No. 2012-027107 with English translation.

Notice of Reasons for Refusal dated Aug. 27, 2013 from the Japanese Patent Office in counterpart application No. 2012-027107 with English translation.

Notification of Reasons for Refusal dated Mar. 10, 2015 for the counterpart Japanese application No. 2012-027107 (English translation attached).

Office Action dated Sep. 1, 2016 for the counterpart Chinese patent application No. 201310050754.3, with English translation.

* cited by examiner

TOUCH-SENSITIVE INPUT DEVICE

The present application claims priority under 35 U.S.C. § 119 of Japanese Patent Application No. 2012-027107 filed on Feb. 10, 2012, the disclosure of which is expressly incorporated by reference herein in its entity.

BACKGROUND OF THE INVENTION

Technical Field

The invention relates to input devices provided with touch sensors.

Background Art

A conventional input device of this type is disclosed in Japanese Unexamined Patent Publication No. 2006-281601 and shown in FIG. 12. The input device includes an ornamental panel P and a touch sensor T. The ornamental panel P has a transparent base 1 in sheet form that is touchable by an object to be detected such as a finger, a plastic part 2 disposed on the base 1, and an ornamental layer 3 provided between the base 1 and the plastic part 2. The touch sensor T is fixed to a back face of the plastic part 2.

SUMMARY OF INVENTION

The touch sensor T of the above conventional input device is fixed to the back face of the plastic part 2, resulting in increased distance from the outer face of the base 1 to the touch sensor T. This could lead to reduction in sensitivity of the touch sensor T for detecting an object that has touched the outer face of the base 1.

Also, the input device is attached to an electronic device D with ribbed parts 4a on the back face of the plastic part 2. The ribbed parts 4a interfere with fixing the touch sensor T to the back face of the plastic part 2, which may lead to poor yield rate of the input device.

In view of the above circumstances, the invention provides an improved input device in terms of the sensitivity of a touch sensor and the yield rate.

An input device according to an aspect of the invention includes a base, a plastic part provided on the base, and a touch sensor embedded in the plastic part. Embedding the touch sensor in the plastic part contributes to reduced distance from an outer face of the base to the touch sensor, thereby improving the sensitivity of the touch sensor. Embedding the touch sensor in the plastic part also makes it possible to omit a step of fixing the touch sensor to the plastic part, thereby improving the yield rate of the input device.

The touch sensor may be disposed on the base. This aspect of the invention can further reduce the distance from the outer face of the base to the touch sensor, contributing to further improvement of the sensitivity of the touch sensor.

The touch sensor may be embedded in the plastic part in spaced relation to the base. According to this aspect of the invention, as the touch sensor is located within the plastic part in spaced relation to the base, the touch sensor can be disposed at an appropriate position to provide the best sensitivity.

The input device may further include a spacer. The spacer and the touch sensor may be embedded in the plastic part, with the spacer disposed on the base and the touch sensor disposed on the spacer. According to this aspect of the invention, the spacer is interposed between the base and the touch sensor. By determining the thickness of the spacer so as to optimize the sensitivity of the touch sensor, the touch sensor can be disposed at an appropriate position to provide the best sensitivity.

This aspect of the invention is further advantageous because the spacer is disposed on the base and the touch sensor is disposed on the spacer. The touch sensor, if provided on a flexible base, may cause irregularities of the base when molding the plastic part because functional requirements of the touch sensor restrict its modification of the outer shape and/or material. However, this aspect of the invention hardly restrict the outer shape and/or material of the spacer to be disposed on the base, unlike the touch sensor, so that it is possible to select the outer shape and/or material of the spacer so as to hardly cause irregularities on the flexible base due to its outer shape when molding the plastic part. For example, all of the edges of the spacer on the side of the base may be curved, or the spacer may be made of material in the same group as that of the material for the base, or it may be of an elastic material.

The plastic part may include a first opening provided on an opposite side of the touch sensor from the base. According to this aspect of the invention, the plastic part provided with the first opening can be fabricated with reduced amount of plastic material, leading to reduced cost of the input device. Moreover, as the touch sensor is embedded below the first opening of the plastic part, it is possible to compensate reduction in strength of the plastic part due to reduced thickness of the plastic part by providing the first opening.

Alternatively, the plastic part may include a first opening provided on an opposite side of the touch sensor from the spacer. According to this aspect of the invention, the plastic part provided with the first opening can be fabricated with reduced amount of plastic material, leading to reduced cost of the input device. Moreover, as the spacer is embedded below the first opening of the plastic part, it is possible to compensate reduction in strength of the plastic part due to reduced thickness of the plastic part by providing the first opening.

The input device may further include a connecting part connected to the touch sensor and embedded in the plastic part. The connecting part may include an external connecting portion. The plastic part may include a second opening that exposes at least the external connecting portion. According to this aspect of the invention, the external connecting portion of the connecting part is exposed from the second opening of the plastic part, facilitating the connection of the touch sensor to external equipment of the input device.

Alternatively, the connecting part may include a first end. In this case, the second opening of the plastic part may expose at least the first end. According to this aspect of the invention, the first end of the connecting part is exposed from the second opening of the plastic part can be connected to external equipment of the input device, facilitating the connection of the touch sensor to external equipment of the input device.

Alternatively, the connecting part may include a first end protruding from the plastic part. According to this aspect of the invention, the first end of the connecting part protruding from the plastic part can be connected to external equipment of the input device, facilitating the connection of the touch sensor to external equipment of the input device.

The input device may further include an engaging part being partially embedded in the plastic part, partially exposed from the second opening of the plastic part, and engaged with the connecting part. According to this aspect of the invention, the engaging part engaged with the connecting part can restrict movement of the part of the connecting part protruding from the second opening when insert-molding or otherwise embedding the touch sensor and the connecting part in the plastic part. It is thus possible to improve the operating efficiency in embedding the touch sensor and the connecting part.

The input device may further include a touch sensing surface being touchable by a detection object. In this case, the distance between the touch sensor and the touch sensing surface may be generally constant. According to this aspect of the invention, the generally constant distance between the touch sensor and the touch sensing surface results in a generally constant sensitivity in the whole area of the touch sensor. Alternatively, the touch sensing surface may be provided in the base.

At least one of the base and the plastic part may have translucency. Alternatively, at least one of the base, the plastic part, or the spacer may have translucency.

In the case where the base has translucency, the input device may further include an ornamental layer provided between the base and the plastic part.

The input device may further include a circuit board and a connecting part. The circuit board may be embedded in the plastic part, and the connecting part may be embedded in the plastic part for connecting the touch sensor to the circuit board. According to this aspect of the invention, as the connecting part and the circuit board are embedded in the plastic part, there is no need to form an opening in the plastic part. It is thus possible to increase the strength of the input device.

DESCRIPTION OF EMBODIMENTS

Figure 1A:
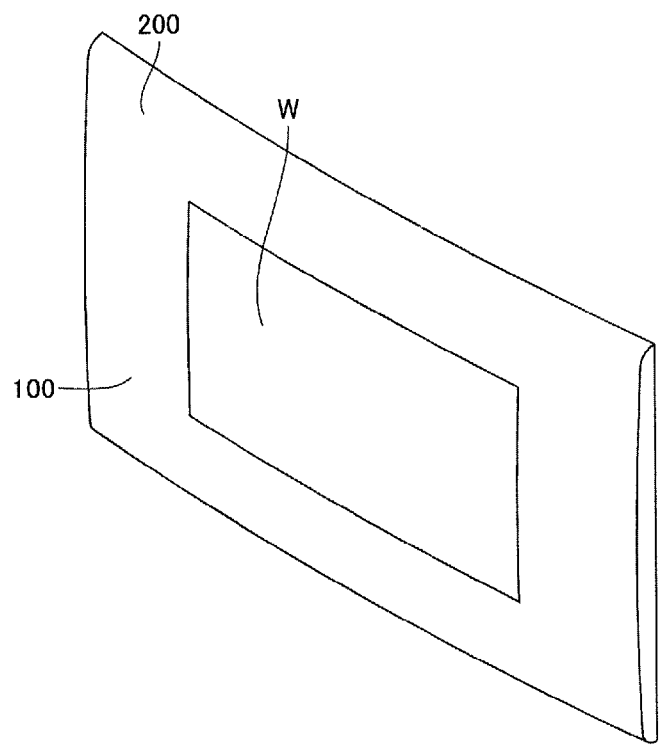
FIG. 1A is a schematic front, top, and right side perspective view of an input device in accordance with the First embodiment of the invention.

The First to Fifth embodiments of the invention will be described below by way of example.

First Embodiment

First, an input device in accordance with The First embodiment will be described with reference to FIG. 1A to FIG. 2B. The input device shown in FIG. 1A to FIG. 2B includes a base 100, an ornamental layer 200, a plastic part 300, a touch sensor 400, a connecting part 500, and an engaging part 600. These constituents of the input device will be described below in detail. The plastic part 300, the base 100, and the ornamental layer 200 constitute an ornamental panel of the input device.

The base 100 is a substantially rectangular flexible film of optically transparent resin such as PET (polyethylene terephthalate) and acrylic resin. The base 100 has an outer face and an inner face (the lower and upper faces in FIG. 2A and FIG. 2B). As shown, the periphery of the inner face of the base 100 is subjected to ornamental printing (e.g. painted in black) in a frame shape to form the ornamental layer 200. The ornamental layer 200 defines a rectangular transparent window W in the center of the base 100 as shown in FIG. 1A. The transparent window W on the outer face of the base 100 serves as a touch sensing surface. An bonding layer G1 is applied to the inner face of the base 100 and the ornamental layer 200.

The touch sensor 400 is a capacitive touch panel of substantially rectangular shape and in rigid or flexible and optically transparent sheet form to detect a detection object such as a finger that touches the touch sensing surface. The touch sensor 400 is fixed to the inner face of the transparent window W of the base 100 and an inner periphery of the ornamental layer 200 via the bonding layer G1 and an adhesive layer G2 (that is, the touch sensor 400 is laid on the transparent window W of the base 100 and the inner periphery of the ornamental layer 200). The touch sensor 400 extends substantially parallel to the outer face of the base 100, maintaining a constant distance between the touch sensor 400 and the outer face of the base 100 (the touch sensing surface).

If the touch sensor 400 is in a rigid transparent sheet form, it may have any one of the configurations (1) to (3) indicated below. If the touch sensor 400 is in a flexible transparent sheet form, it may have any one of the configurations (4) to (6) indicated below.

1) The touch sensor 400 includes a first transparent substrate having first and second faces in its thickness direction, a plurality of first transparent electrodes provided on the first face of the first transparent substrate, and a plurality of second transparent electrodes provided on the second face of the first transparent substrate.

2) The touch sensor 400 includes a first transparent substrate, a plurality of first transparent electrodes provided on the first transparent substrate, an insulating layer provided on the first transparent substrate so as to cover the first transparent electrodes, and a plurality of second transparent electrodes provided on the insulating layer.
3) The touch sensor 400 includes a first transparent substrate having a first face, a second transparent substrate having a first face opposed to the first face of the first transparent substrate, a plurality of first transparent electrodes provided on the first face of the first transparent substrate, and a plurality of second transparent electrodes provided on the first face of the second transparent substrate.
4) The touch sensor 400 includes a flexible insulating first transparent film having first and second faces in its thickness direction, a plurality of first transparent electrodes provided on the first face of the first transparent film, and a plurality of second transparent electrodes provided on the second face of the first transparent film.
5) The touch sensor 400 includes a flexible insulating first transparent film, a plurality of first transparent electrodes provided on the first transparent film, a flexible insulating second transparent film provided on the first transparent film so as to cover the first transparent electrodes, and a plurality of second transparent electrodes provided on the second transparent film.
6) The touch sensor 400 includes a flexible insulating first transparent film having a first face, a flexible insulating second transparent film having a first face opposed to the first face of the first transparent film, a plurality of first transparent electrodes provided on the first face of the first transparent film, and a plurality of second transparent electrodes provided on the first face of the second transparent film.

It should be appreciated that the base 100 may be used as the first transparent film. In the case where the base 100 has no flexibility, it may be used as the first transparent substrate.

The connecting part 500 has flexibility. Specifically, the connecting part 500 is a flexible printed circuit board (PCB) (see FIG. 2A and FIG. 2B) or a flexible insulating transparent film. The connecting part 500 has lengthwise opposite ends, namely a first end 510 and a second end 520. If the connecting part 500 is a flexible PCB, the second end 520 is connected to at least one of the first and second transparent substrates or of the first and second transparent films of the touch sensor 400, and the flexible PCB has a plurality of conducting lines connected to the first and second transparent electrodes. If the connecting part 500 is a flexible insulating transparent film, the second end 520 is connected to at least one of the first and second transparent substrates or of the first and second transparent films of the touch sensor 400, and the transparent film has a plurality of conducting lines connected to the first and second transparent electrodes.

Figure 2A:
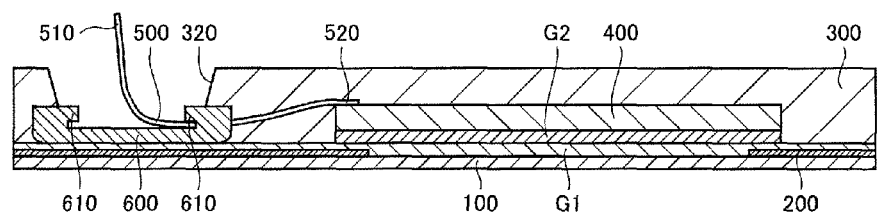
FIG. 2A is a schematic partial end view of the input device taken along 2A-2A in FIG. 1B.
Figure 2B:
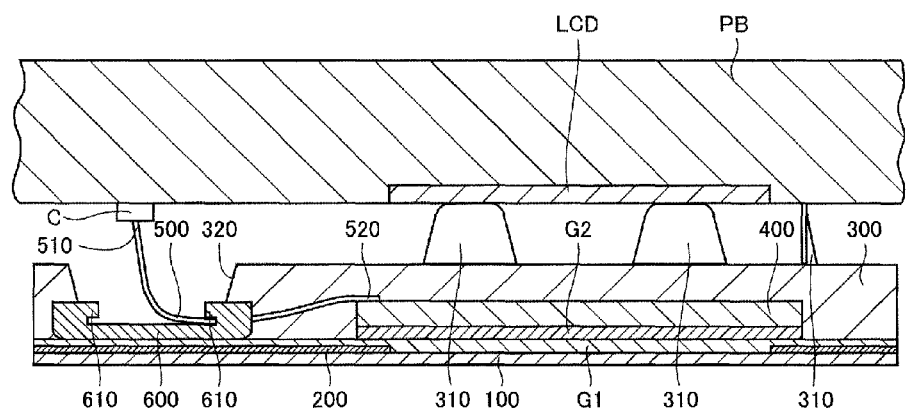
FIG. 2B is a schematic partial sectional view of the input device taken along 2B-2B in FIG. 1B in the state where the input device is mounted on an electronic device.

The engaging part 600 is a block having a substantially U-shaped cross section. It may be made of insulating resin, elastomer, adhesive such as hot-melt adhesive and OCA (Optically Clear Adhesive), a double-faced tape, or metal such as Steel Use Stainless (SUS). As shown in FIG. 2A and FIG. 2B, the engaging part 600 is fixed to the ornamental layer 200 of the base 100 with the bonding layer G1. One of the longitudinal ends of the engaging part 600 has a receiving hole (not shown) to receive the connecting part 500. An engaging piece 610 projects inward from each longitudinal distal end of the engaging part 600. One of the engaging pieces 610 is engaged with the connecting part 500 passed through the receiving hole.

Figure 1B:
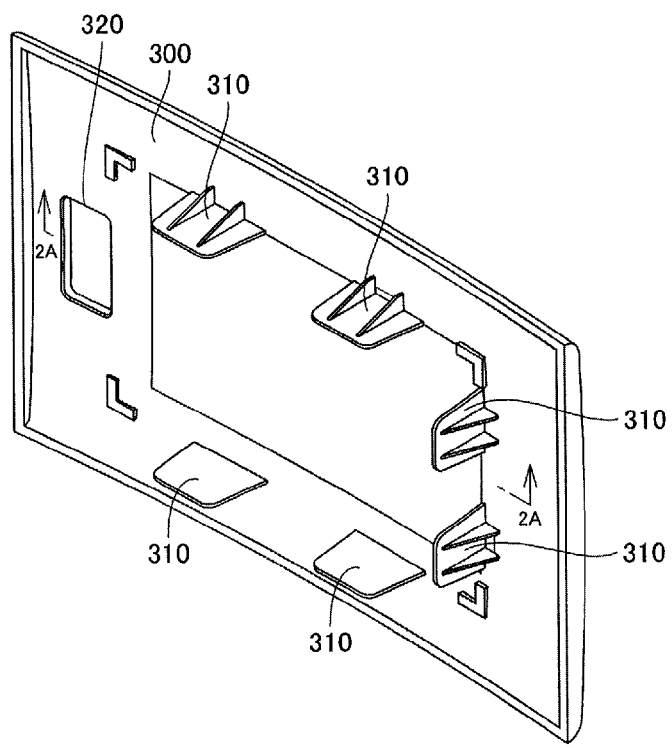
FIG. 1B is a schematic rear, top and left side perspective view of the input device.

As shown in FIG. 2A and FIG. 2B, the plastic part 300 is substantially rectangular part made of insulating thermosoftening or thermosetting plastic. The plastic part 300 is provided on the inner face of the base 100 and the ornamental layer 200. The base 100 is generally in intimate contact with or integrated into the plastic part 300 and has hardened (i.e. has lost its flexibility). The plastic part 300 maintains the touch sensing surface of the base 100 in a flat state. Embedded in the plastic part 300 of the ornamental panel are the touch sensor 400, about half of the connecting part 500 on the second end 520 side, and both longitudinal ends and both widthwise ends of the engaging part 600 (that is, the periphery of the engaging part 600). The plastic part 300 has a substantially rectangular central area, corresponding to the transparent window W of the base 100, and a peripheral area around the central area. The back face of the plastic part 300 is provided with a plurality of ribbed parts 310 surrounding the central area in a lateral U-shape arrangement as shown in FIG. 1B. The ribbed parts 310 can be fixed to a housing or a circuit board PB (see FIG. 2B) of an electronic device for installing the input device. The first end 510 of the connecting part 500 is connectable to the circuit board PB of the electronic device. A rectangular opening 320 (corresponding to the second opening in the claims) is formed in an end (the left end in FIG. 2A and FIG. 2B) of the peripheral area of the plastic part 300. The opening 320 exposes the central portion (the portion inside the aforementioned periphery) of the engaging part 600 and the about half of the connecting part 500 on the first end 510 side to the outside of the plastic part 300.

The input device configured as described above may be manufactured in the following steps. First, the base 100 is prepared. The periphery of the inner face of the base 100 is subjected to ornamental printing such as gravure printing to form the ornamental layer 200. After that, the bonding layer G1 is applied or formed in any other process on the inner face of the base 100 and the ornamental layer 200.

Also prepared are the touch sensor 400, with the connecting part 500 connected thereto, and the engaging part 600. After that, the first end 510 of the connecting part 500 is inserted into the receiving hole of the engaging part 600. This insertion causes the connecting part 500 to be engaged with one of the engaging pieces 610 of the engaging part 600. Then, the adhesive layer G2 is applied or formed in any other process on the touch sensor 400. After that, the touch sensor 400 is placed on and along the inner face of the base 100 and the ornamental layer 200. At the same time, the engaging part 600 is mounted at a predetermined position (the position corresponding to the opening 320 of the plastic part 300) on the ornamental layer 200. As a result, the touch sensor 400 is fixed to the inner face of the base 100 and the ornamental layer 200 with the bonding layer G1 and the adhesive layer G2. The engaging part 600 is also fixed to the ornamental layer 200 with the bonding layer G1.

After that, the base 100 with the ornamental layer 200, the touch sensor 400, the connecting part 500, and the engaging part 600 are placed in a first mold (not shown), onto which the outer face of the base 100 is fixed. The first mold is then combined with a second mold (not shown). Then, a convex portion of the second mold comes into contact with the central portion of the engaging part 600. Also, the about half of the connecting part 500 on the first end 510 side is received in a recess formed in the convex portion, or alternatively, the convex portion comes into contact with the about half of the connecting part 500 on the first end 510 side. In this state, thermosoftening or thermosetting plastic is poured into the first and second molds to insert mold the touch sensor 400, the about half of the connecting part 500 on the second end 520 side, and the periphery of the engaging part 600 in the thermosoftening or thermosetting plastic. The hardened thermosoftening or thermosetting plastic forms the plastic part 300. Thus embedded by insert molding in the plastic part 300 are: the touch sensor 400 as placed on the base 100, the about half of the connecting part 500 on the second end 520 side as connected to the touch sensor 400, and the periphery of the engaging part 600. This insert molding process also forms the opening 320 of the plastic part 300, conforming to the convex portion of the second mold, and the plurality of ribbed parts 310 of the plastic part 300 from the thermosoftening or thermosetting plastic entered in a plurality of recesses of the second mold. The base 100 is brought into close contact with or integrated with the plastic part 300, and it hardens. After that, the first and second molds are removed. Then, the central portion of the engaging part 600 and the about half of the connecting part 500 on the first end 510 side are exposed from the opening 320 of the plastic part 300 to the outside of the plastic part 300.

The input device thus manufactured may be installed in an electronic device in the following manner. First, the first end 510 of the connecting part 500 is connected to a connector C on the circuit board PB of the electronic device. The thus connected input device is fixed to the circuit board PB of the electronic device with a screw or other means as shown in FIG. 2B. Simultaneously, the ribbed parts 310 are engaged with the housing or the circuit board PB of the electronic device. The input device is thus mounted to the electronic device. The circuit board PB of the electronic device may or may not have an LCD (Liquid Crystal Display) mounted thereon. In the former case, when the input device is fixed to the housing or the circuit board PB, the LCD is located on the back side of the central area of the plastic part 300. That is, the LCD is visually recognizable from the outside through the central area of the plastic part 300, the touch sensor 400, and the transparent window W of the base 100.

The input device of this embodiment has many technical features. First, the touch sensor 400 as disposed on the inner face of the base 100 is embedded in the plastic part 300 of the ornamental panel by insert molding, reducing the distance between the outer face of the base 100 and the touch sensor 400. It is therefore possible to improve the sensitivity of the touch sensor 400. Moreover, as the touch sensor 400 is insert-molded in the plastic part 300, it is possible to omit a step of fixing the touch sensor 400 to the plastic part 300. This should increase the yield rate of the input device. Further, the touch sensor 400 embedded in the plastic part 300 can be disposed at a large distance from the LCD that may be disposed on the back side of the touch sensor 400. It is therefore possible to omit a shield between the LCD and the touch sensor 400 for shielding noise from the LCD.

Generally speaking, in the case where a sheet has flexibility when molding the plastic part, providing an opening in the plastic part tends to cause the sheet to have a sink mark at a portion exposed from the opening, cause light leaks from the opening of the plastic part, and/or cause the plastic part to decrease in strength due to its reduced thickness. However, in the present input device, the opening 320 for leading out the connecting part 500 is formed in the plastic part 300 so as to expose the central portion of the engaging part 600 fixed to the base 100. In other words, the engaging part 600 is embedded below the opening 320 of the plastic part 300 and in contact with the base 100. Therefore, the base 100 is less likely to have a sink mark when molding the plastic part 300, and the plastic part 300 is less likely to suffer from light leaks from its opening 320 or decreased strength due to its reduced thickness.

Second Embodiment

Figure 3:
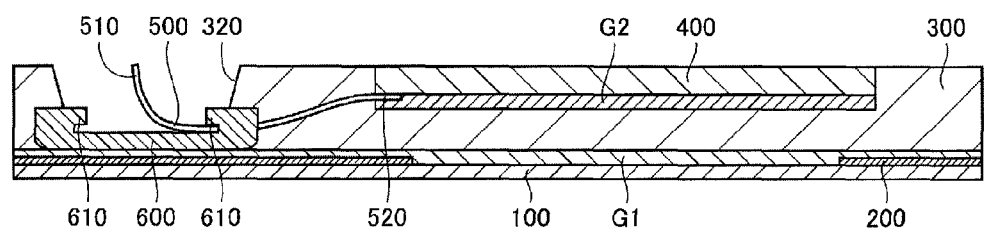
FIG. 3 is a schematic partial end view of an input device in accordance with the Second embodiment of the invention.

Next, an input device in accordance with the Second embodiment will be described with reference to FIG. 3. The input device shown in FIG. 3 has substantially the same configuration as that of the First embodiment, except that the touch sensor 400 is embedded in the plastic part 300 in spaced relation to the base 100. This difference will be described below in detail, but redundant descriptions will be omitted. Constituents of the present input device are given the same reference numerals as those for the First embodiment because only the embedding position of the touch sensor 400 is changed as described above.

The touch sensor 400 has the same configuration of that of the First embodiment. The touch sensor 400 is embedded in the central area of the plastic part 300 such that it extends substantially in parallel to the outer face (lower face in the figure) of the base 100, and that the back face (upper face in the figure) of the touch sensor 400 is flush with the back face of the plastic part 300. That is, there is a clearance between the touch sensor 400 and the base 100, and there is a constant distance between the touch sensor 400 and the outer face (the touch sensing surface) of the base 100. The adhesive layer G2 is attached to a front face (lower face in the figure) of the touch sensor 400. The adhesive layer G2 improves adhesiveness between the touch sensor 400 and the plastic part 300.

The input device configured as described above may be manufactured in the following steps. First, as in the First embodiment, the base 100 formed with the ornamental layer 200 is prepared. After that, the bonding layer G1 is applied or formed in any other process on the inner face of the base 100 and the ornamental layer 200.

Also prepared are the touch sensor 400, with the connecting part 500 connected thereto, and the engaging part 600. After that, the first end 510 of the connecting part 500 is inserted into the receiving hole of the engaging part 600. This insertion causes the connecting part 500 to be engaged with one of the engaging pieces 610 of the engaging part 600. After that, the engaging part 600 is mounted at a predetermined position (the position corresponding to an opening 320 of the plastic part 300) on the ornamental layer 200. As a result, the engaging part 600 is fixed to the ornamental layer 200 with the bonding layer G1. Then, the adhesive layer G2 is applied or formed in any other process on the touch sensor 400.

After that, the base 100 with the ornamental layer 200, the touch sensor 400, the connecting part 500, and the engaging part 600 are placed in a first mold (not shown), onto which the outer face of the base 100 is fixed. The touch sensor 400 is fixed to a second mold (not shown). Then, the first mold is combined with the second mold. Then, a convex portion of the second mold comes into contact with the central portion of the engaging part 600. Also, the about half of the connecting part 500 on the first end 510 side is received in a recess formed in the convex portion, or alternatively, the convex portion comes into contact with the about half of the connecting part 500 on the first end 510 side. In this state, thermosoftening or thermosetting plastic is poured into the first and second molds to insert mold the touch sensor 400, the about half of the connecting part 500 on the second end 520 side, and the periphery of the engaging part 600 in the thermosoftening or thermosetting plastic. The hardened thermosoftening or thermosetting plastic forms the plastic part 300. Thus embedded by insert molding in the plastic part 300 are: the touch sensor 400 in spaced relation to and in parallel to the base 100, the about half of the connecting part 500 on the second end 520 side as connected to the touch sensor 400, and the periphery of the engaging part 600. This insert molding process also forms the opening 320 of the plastic part 300, conforming to the convex portion of the second mold, and the plurality of ribbed parts 310 of the plastic part 300 from the thermosoftening or thermosetting plastic entered in the plurality of recesses of the second mold. The base 100 is brought into close contact with or integrated with the plastic part 300, and it hardens. After that, the first and second molds are removed. Then, the central portion of the engaging part 600 and the about half of the connecting part 500 on the first end 510 side are exposed from the opening 320 of the plastic part 300 to the outside of the plastic part 300.

The input device thus manufactured may be installed in an electronic device in the same manner as in the First embodiment. The input device can produce the same effects as that of the First embodiment. Moreover, as the touch sensor 400 is embedded in the plastic part 300 in spaced relation to the base 100, the touch sensor 400 can be easily located at an optimum position.

Third Embodiment

Figure 4:
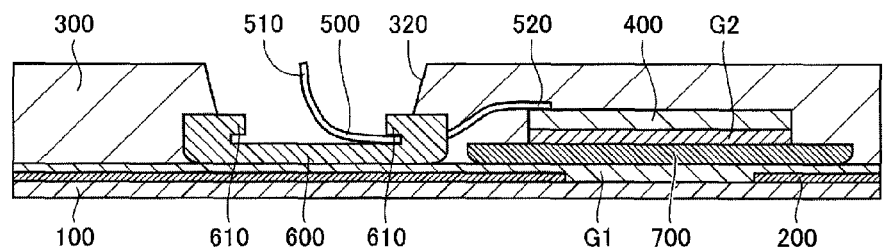
FIG. 4 is a schematic partial end view of an input device in accordance with the Third embodiment of the invention.

Next, an input device in accordance with the Third embodiment will be described with reference to FIG. 4 and FIG. 5. The input device shown in FIG. 4 has substantially the same configuration as that of the First embodiment, except that a spacer 700 is additionally provided between a base 100 and a touch sensor 400. This difference will be described below in detail, but redundant descriptions will be omitted. Constituents of the present input device are given the same reference numerals as those for the First embodiment because the difference is the additionally provided spacer 700 only.

The spacer 700 is a substantially rectangular transparent plate formed of insulating plastic, elastomer, adhesive such as hot-melt adhesive and OCA (Optically Clear Adhesive), or a double-faced adhesive tape. The spacer 700 has a larger length than the touch sensor 400 and has a larger width than the touch sensor 400. The spacer 700 is fixed on a transparent window W of the base 100 and an inner periphery of an ornamental layer 200 with a bonding layer G1 (that is, the spacer 700 is disposed on and along the transparent window W of the base 100 and the inner periphery of the ornamental layer 200).

Figure 5:
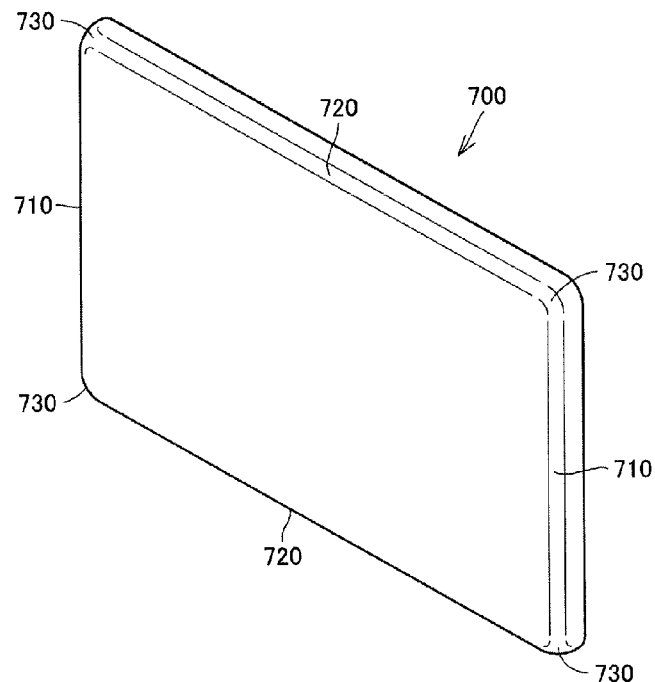
FIG. 5 is a schematic front, bottom, and right side perspective view of the spacer of the input device.

As shown in FIG. 5, the spacer 700 has curved (rounded) edges on the side of the base 100, namely edges 710 at opposite longitudinal ends, edges 720 at opposite widthwise ends, and four corner edges 730. All of the edges 710, 720, and 730 are curved to prevent the outer shape of the spacer 700 from appearing as irregularities on the outer face of the base 100 having flexibility when forming the plastic part 300.

The touch sensor 400 is fixed to the spacer 700 with an adhesive layer G2. That is, the spacer 700 is disposed on the base 100 and the touch sensor 400 is disposed on the spacer 700 (i.e. the spacer 700 and the touch sensor 400 are stacked in this order on the base 100). The touch sensor 400 and the spacer 700 in the stacked state are embedded in the plastic part 300.

The input device configured as described above may be manufactured in the following steps. First, as in the First embodiment, the base 100 formed with the ornamental layer 200 is prepared. After that, a bonding layer G1 is applied or formed in any other process on the inner face of the base 100 and the ornamental layer 200. The spacer 700 is also prepared. The spacer 700 is mounted on the inner face of the base 100 and the ornamental layer 200 so as to be fixed to the inner face of the base 100 and the ornamental layer 200 with the bonding layer G1.

Also prepared are the touch sensor 400, with a second end 520 of a connecting part 500 connected thereto, and the engaging part 600. After that, a first end 510 of the connecting part 500 is inserted into a receiving hole of the engaging part 600. This insertion causes the connecting part 500 to be engaged with one of the engaging pieces 610 of the engaging part 600. Then, the adhesive layer G2 is applied or formed in any other process on the touch sensor 400. The touch sensor 400 is then mounted on the spacer 700, and the engaging part 600 is mounted at a predetermined position (the position corresponding to an opening 320 of the plastic part 300) on the ornamental layer 200. As a result, the touch sensor 400 is fixed to the spacer 700 with the adhesive layer G2. The engaging part 600 is fixed to the ornamental layer 200 with the bonding layer G1.

After that, the base 100 with the ornamental layer 200, the spacer 700, the touch sensor 400, the connecting part 500, and the engaging part 600 are placed in a first mold (not shown), onto which the outer face of the base 100 is fixed. Then, the first mold is combined with a second mold (not shown). Then, a convex portion of the second mold comes into contact with a central portion of the engaging part 600. Also, the about half of the connecting part 500 on the first end 510 side is received in a recess formed in the convex portion, or alternatively, the convex portion comes into contact with the about half of the connecting part 500 on the first end 510 side. In this state, thermosoftening or thermosetting plastic is poured into the first and second molds to insert mold the spacer 700, the touch sensor 400, the about half of the connecting part 500 on the second end 520 side, and the periphery of the engaging part 600 in the thermosoftening or thermosetting plastic. The hardened thermosoftening or thermosetting plastic forms the plastic part 300. Thus embedded by insert molding in the plastic part 300 are: the spacer 700 and the touch sensor 400 disposed thereon, the about half of the connecting part 500 on the second end 520 side as connected to the touch sensor 400, and the periphery of the engaging part 600. This insert molding process also forms the opening 320 of the plastic part 300, conforming to the convex portion of the second mold, and the plurality of ribbed parts 310 of the plastic part 300 from the thermosoftening or thermosetting plastic entered in a plurality of recesses of the second mold. The base 100 is brought into close contact with or integrated with the plastic part 300, and it hardens. After that, the first and second molds are removed. Then, the central portion of the engaging part 600 and the about half of the connecting part 500 on the first end 510 side are exposed from the opening 320 of the plastic part 300 to the outside of the plastic part 300.

The input device thus manufactured may be installed in an electronic device in the same manner as in the First embodiment. The input device can produce the same effects as that of the First embodiment. Moreover, the spacer 700 is interposed between the touch sensor 400 and the base 100. The thickness of the spacer 700 can be determined so as to optimize the sensitivity of the touch sensor 400. It is therefore easy to dispose the touch sensor 400 at an appropriate position to provide the best sensitivity.

Fourth Embodiment

Figure 6:
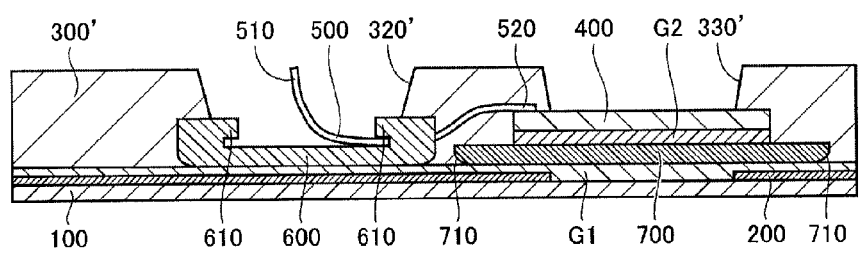
FIG. 6 is a schematic partial end view of an input device in accordance with the Fourth embodiment of the invention.

Next, an input device in accordance with the Fourth embodiment will be described with reference to FIG. 6. The input device shown in FIG. 6 has substantially the same configuration as that of the Third embodiment, except an additional opening 330' in a plastic part 300'. This difference will be described below in detail, but redundant descriptions will be omitted. A symbol _'_ is added to the reference numerals of the plastic part and its subcomponents to distinguish them from the plastic part 300 and its subcomponents of the Third embodiment.

The opening 330' (corresponding to the first opening in the claims) of the plastic part 300' is formed on the back side of the touch sensor 400 (on the opposite side from a spacer 700) so as to expose a central portion of the touch sensor 400.

The spacer 700 as disposed on the base 100 is embedded in the plastic part 300'. The touch sensor 400 is disposed on the spacer 700 and its periphery is embedded in the plastic part 300'. In other words, the touch sensor 400 and the spacer 700 are embedded below the opening 330', and the central portion of the touch sensor 400 is exposed from the opening 330'.

The input device configured as described above may be manufactured in the following steps. The manufacturing steps are the same as those in the Third embodiment until the spacer 700 and the touch sensor 400 are stacked in this order on the inner face of the base 100 and the ornamental layer 200 and the engaging part 600 is fixed to the ornamental layer 200.

The next step is to place the base 100 with the ornamental layer 200, the spacer 700, the touch sensor 400, the connecting part 500, and the engaging part 600 in a first mold (not shown) and fix the outer face of the base 100 to the first mold. The first mold is then combined with a second mold (not shown). Then, a first convex portion of the second mold comes into contact with the central portion of the engaging part 600, and a second convex portion of the second mold comes into contact with a central portion of the touch sensor 400. Also, about half of the connecting part 500 on the first end 510 side is received in a recess formed in the first convex portion, or alternatively, the convex portion comes into contact with the about half of the connecting part 500 on the first end 510 side. In this state, thermosoftening or thermosetting plastic is poured into the first and second molds to insert mold the spacer 700, the periphery of the touch sensor 400, the about half of the connecting part 500 on the second end 520 side, and the periphery of the engaging part 600 in the thermosoftening plastic or thermosetting plastic. The hardened thermosoftening or thermosetting plastic forms the plastic part 300'. The spacer 700 and the periphery of the touch sensor 400 are thus embedded in the plastic part 300', with the spacer 700 disposed on the base 100 and the touch sensor 400 disposed on the spacer 700. Also embedded in the plastic part 300' are the about half of the connecting part 500 on the second end 520 side as connected to the touch sensor 400, and the periphery of the engaging part 600. This insert molding process also forms an opening 320' of the plastic part 300' conforming to a first convex portion of the second mold, an opening 330' of the plastic part 300' conforming to a second convex portion of the second mold, and a plurality of ribbed parts of the plastic part 300' from the thermosoftening or thermosetting plastic entered in a plurality of recesses of the second mold. The base 100 comes into close contact with or is integrated with the plastic part 300', and it hardens. After that, the first and second molds are removed. Then, the central portion of the engaging part 600 and the about half of the connecting part 500 on the first end 510 side are exposed from the opening 320', and the central portion of the touch sensor 400 is exposed from the opening 330'.

The input device thus manufactured may be installed in an electronic device in the same manner as in the First embodiment. The input device can produce the same effects as that of the Third embodiment. Moreover, as the plastic part 300' has the opening 330' on the back side of the touch sensor 400, it is possible to reduce the amount of plastic for the plastic part 300' and improve the transmittance of the portion of the plastic part 300' corresponding to the touch sensor 400.

Generally speaking, in the case where a sheet has flexibility when molding the plastic part, providing an opening in the plastic part tends to cause the sheet to have a sink mark at a portion exposed from the opening, cause light leaks from the opening of the plastic part, and/or cause the plastic part to decrease in strength due to its reduced thickness. However, in the present input device, the opening 330' is formed in the plastic part 300' so as to expose the central portion of the touch sensor 400. In other words, the spacer 700 and the touch sensor 400 as disposed on the base 100 are embedded below the opening 330' of the plastic part 300'. Therefore, the base 100 is less likely to have a sink mark when molding the plastic part 300', and the plastic part 300' is less likely to suffer from light leaks from its opening 330' or decreased strength due to its reduced thickness.

Fifth Embodiment

Figure 7:
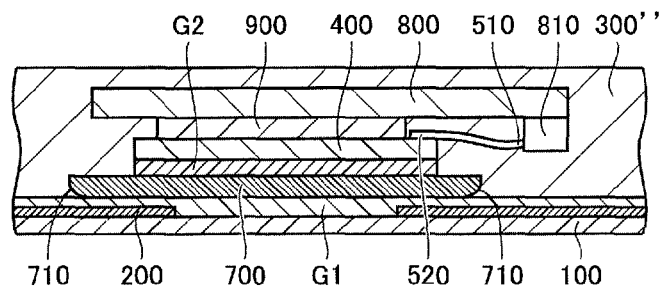
FIG. 7 is a schematic partial end view of an input device in accordance with the Fifth embodiment of the invention.

Next, an input device in accordance with the Fifth embodiment will be described with reference to FIG. 7. The input device shown in FIG. 7 has substantially the same configuration as the input device in the Third embodiment, except that a circuit board 800 and a support 900 are provided in place of an engaging part 600. This difference will be described below in detail, but redundant descriptions will be omitted. A symbol _"_ is added to the reference numerals of the plastic part and its subcomponents to distinguish them from the plastic part 300 and its subcomponents of the Third embodiment.

A spacer 700, a touch sensor 400, the support 900, and the circuit board 800 are stacked on the base 100 in this order and embedded in the plastic part 300". The support 900 is made of a same or similar material as the spacer 700, and it is disposed on the touch sensor 400 to support the circuit board 800. The circuit board 800 corresponds to a circuit board PB of the electronic device. That is, the circuit board 800 of the electronic device is installed in the plastic part 300" of the input device. A connector 810 is mounted on the circuit board 800. A first end 510 of the connecting part 500 is connected to the connector 810. The connecting part 500 is embedded in the plastic part 300", with its second end 520 connected to the touch sensor 400 and its first end 510 connected to the connector 810.

The plastic part 300" is different from the plastic part 300 in the lack of ribbed parts 310 and an opening 320. That is, the plastic part 300" is a rectangular member of insulating thermosoftening or thermosetting plastic provided on the base 100.

The input device configured as described above may be manufactured in the following steps. First, as in the First embodiment, the base 100 formed with the ornamental layer 200 is prepared. After that, a bonding layer G1 is applied or formed in any other process on the inner face of the base 100 and the ornamental layer 200. The spacer 700 is also prepared. Then, the spacer 700 is mounted on the inner face of the base 100 and the ornamental layer 200 so as to be fixed to the inner face of the base 100 and the ornamental layer 200 with the bonding layer G1.

Also prepared are the touch sensor 400, with a second end 520 of a connecting part 500 connected thereto. Then, an adhesive layer G2 is applied or formed in any other process on the touch sensor 400. The touch sensor 400 is mounted on the spacer 700 and is thereby fixed to the spacer 700 with the adhesive layer G2. The support 900 is also prepared and fixed to the touch sensor 400. The circuit board 800 is also prepared and fixed to the support 900. As a result, the spacer 700, the touch sensor 400, the support 900, and the circuit board 800 are stacked in this order on the base 100. After that, the first end 510 of the connecting part 500 is connected to the connector 810 of the circuit board 800.

After that, the base 100 with the ornamental layer 200, the spacer 700, the touch sensor 400, the connecting part 500, the support 900, and the circuit board 800 are placed in a first mold (not shown), onto which the outer face of the base 100 is fixed. After that, the first mold is combined with a second mold (not shown). In this state, thermosoftening or thermosetting plastic is poured into the first and second molds to insert mold the spacer 700, the touch sensor 400, the connecting part 500, the support 900, and the circuit board 800 in thermosoftening or thermosetting plastic. The hardened thermosoftening or thermosetting plastic forms the plastic part 300". The spacer 700, the touch sensor 400, the connecting part 500, the support 900 and the circuit board 800 are embedded in the plastic part 300". The base 100 comes into close contact with or is integrated with the plastic part 300", and it hardens. After that, first and second molds are removed.

The input device thus manufactured has many technical features. First, the spacer 700, the touch sensor 400, the support 900, and the circuit board 800 are stacked in this order on the base 100 and embedded in the plastic part 300", reducing the distance between the outer face of the base 100 and the touch sensor 400. Second, the spacer 700 is interposed between the touch sensor 400 and the base 100. The thickness of the spacer 700 can be determined so as to optimize the sensitivity of the touch sensor 400. It is therefore easy to locate the touch sensor 400 at an appropriate position to provide the best sensitivity and thereby to improve the sensitivity of the touch sensor 400. Moreover, as the touch sensor 400 is insert-molded in the plastic part 300", it is possible to omit a step of fixing the touch sensor 400 to the plastic part 300". Third, the connecting part 500 as connecting between the touch sensor 400 and the circuit board 800 is embedded in the plastic part 300", there is no need to lead a part of the connecting part 500 to the outside of the plastic part 300". This should increase the yield of the input device. Further, there is no opening formed in the plastic part 300", increasing the strength of the input device and improving the appearance of the input device.

The input device of the invention is not limited to the embodiments and may be modified within the scope of claims. Specific modifications will be described below.

Figure 8A:
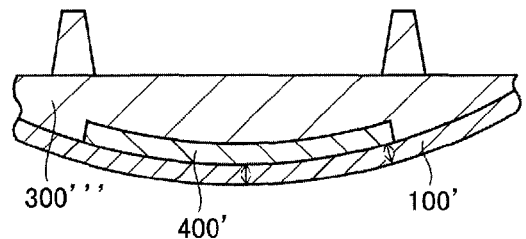
FIG. 8A is a schematic partial end view of a first design modification of the input device in accordance with the First embodiment of the invention.
Figure 8B:
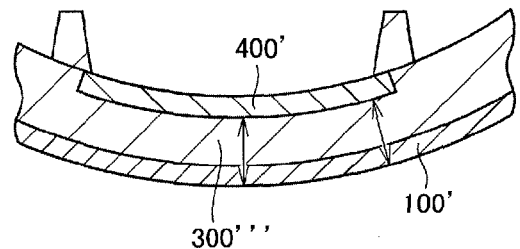
FIG. 8B is a schematic partial end view showing a first design modification of the input device in accordance with the Second embodiment of the invention.
Figure 8C:
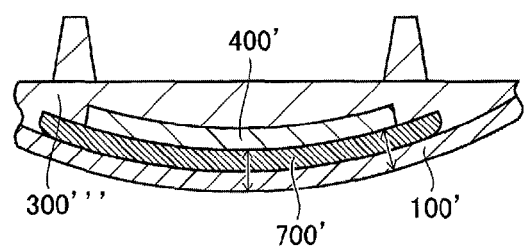
FIG. 8C is a schematic partial end view of a first design modification of the input device in accordance with the Third embodiment of the invention.

In the First to Fifth embodiments, the plastic part maintains the touch sensing surface of the base in a flat state. FIG. 8A to FIG. 8C illustrate a modified plastic part 300''', which is curved so as to maintain a touch sensing surface of a base 100' in a curved form. In any of these illustrated modifications, the plastic part 300''' may have a touch sensor 400' embedded therein in a curved form such that the distance between the touch sensor 400' and the touch sensing surface of the base 100' is generally constant.

More specifically, the touch sensor 400' shown in FIG. 8A is disposed on an inner face of the base 100' and embedded in the plastic part 300''' in a curved form such that the distance between the touch sensor 400' and the touch sensing surface of the base 100' is generally constant. The touch sensor 400' shown in FIG. 8B is embedded in the plastic part 300''' in spaced relation to the base 100' and in a curved form such that the distance between the touch sensor 400' and the touch sensing surface of the base 100' is generally constant. The touch sensor 400' shown in FIG. 8C is disposed on the spacer 700' and is embedded together with the spacer 700' in the plastic part 300''' in a curved form such that the distance between the touch sensor 400' and the touch sensing surface of the base 100' is generally constant. The spacer 700' is in a curved form conforming to the touch sensing surface. In any of these modified input devices, the touch sensor is embedded in the plastic part in a curved form such that the distance between the touch sensor and the touch sensing surface (that is, the outer face of the base) is generally constant. It is therefore possible to keep the sensitivity of the touch sensor generally constant in the whole area. In other words, it is possible to prevent variations in sensitivity of the touch sensor between different areas (for example, between a central area and a peripheral area) due to varying distance from the touch sensor to the touch sensing surface (the outer face of the base). FIG. 8A to FIG. 8C do not show the ornamental layer, the connecting part, the bonding layer, the adhesive layer, or the engaging part, but any of these components with the same configurations as those in the First to Fifth embodiments may be included in any of these modified input devices.

The touch sensor of the invention may be any member in a flexible or rigid sheet form to be embedded in the plastic part. The touch sensor may be a capacitive touch panel as described above or may be a touch panel of resistive, optical, ultrasonic, in-cell, or any other touch sensing type. The touch sensor may also be a touch switch of capacitive, resistive, optical, ultrasonic, in-cell or any other touch sensing type. The touch panel and the touch switch (the touch sensor) may have electrodes on a sheet formed by any known printing method. Further, the touch sensor may be optically opaque. The touch sensing surface may be the outer face of the base as described above or may be any other part that is touchable by a detection object. For example, the touch sensing surface may be an outer face of a panel provided on the outer side of the base.

The plastic part may be modified in any manner as long as it is provided on the base and embeds the touch sensor therein. For example, like the plastic part 300''' shown in FIG. 8A and FIG. 8C, the plastic part may have a curved face contacting the base. Alternatively, like the plastic part 300''' shown in FIG. 8B, the plastic part may have a curved face contacting the base and a curved opposite face. The plastic part 300 of the First to Third embodiments has the opening 320 (second opening), and the plastic part 300' of the Fourth embodiment has the openings 320', 330' (second and first openings, respectively). However, the first and/or second opening may be omitted. If a plastic part is formed without the second opening, the connecting part may have a first end protruding from the plastic part. The first end protruding from the plastic part may be connectable to the outside. Further, the plastic part 300''' shown in FIG. 8A and FIG. 8C may be provided with a first and/or second opening. The first opening may be formed in any area of the plastic part that is on the opposite side of the touch sensor from the base or from the spacer. That is, the first opening may be a recess that does not allow the exposure of any part of the touch sensor. The first opening may be formed in the plastic part of the input device in accordance with the First and Second embodiments. The second opening of the plastic part may be in any form that allows the exposure of at least the external connecting portion of the connecting part or the first end of the connecting part. Further, the ribbed parts may be omitted if the plastic part can be disposed to face the circuit board PB in a stable manner such as by fixing the input device to the circuit board PB of the electronic device with a screw. By "curved" used herein is meant any nonflat surfaces including spherical.

Figure 9:
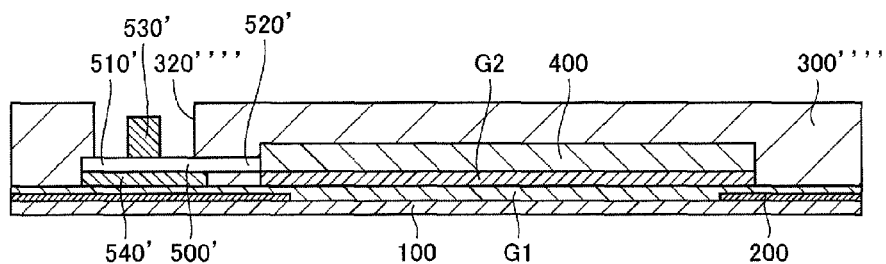
FIG. 9 is a schematic partial end view of a second design modification of the input device in accordance with the First embodiment of the invention.
Figure 10A:
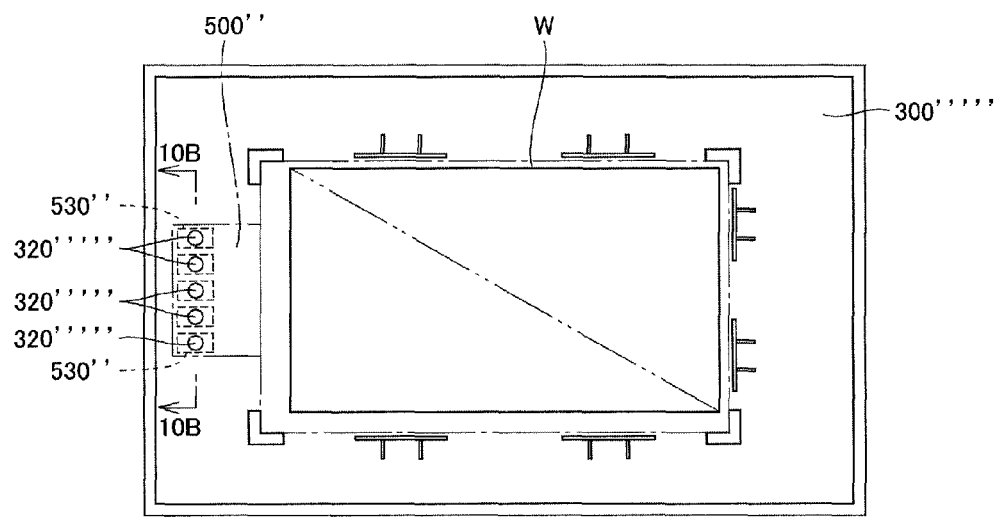
FIG. 10A is a schematic back view showing a third design modification of the input device in accordance with The First embodiment of the invention.
Figure 10B:
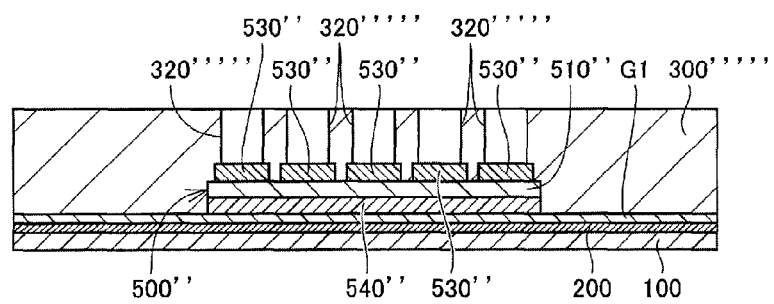
FIG. 10B is a schematic partial enlarged end view of the input device taken along 10B-10B in FIG. 10A.

The connecting part may be a flexible printed circuit board or a flexible sheet as described above. The connecting part may be in any form that can connect the touch sensor to an electronic component (e.g. circuit board) provided inside or outside the plastic part. For example, the connecting part may be a rigid circuit board. Further, the connecting part may have a conducting line provided on the base for connecting the touch sensor to an electronic component. The connecting part may also be a lead wire. FIG. 9 illustrates a modified input device, wherein a connecting part 500' further includes an external connecting portion 530' provided on a first end 510'. The external connecting portion 530' may be a B-to-B (board-to-board) connector, an FPC (flexible printed circuit) connector, or the like. In this modification, a plastic part 300'''' is formed with an opening 320'''' to expose only an area of the first end 510' that is provided with the external connecting portion 530'. FIG. 10A and FIG. 10B illustrate another modified input device, wherein a connecting part 500'' further includes a plurality of external connecting portions 530'' provided on the first end 510''. These external connecting portions 530'' may be contacts or electrodes. In this modification, a plastic part 300'''' is formed with a plurality of openings 320'''' to expose at least the external connecting portions 530''. The connecting part 500'/500'' may further include a reinforcing plate 540'/540'' fixed to the face of the first end 510'/510'' facing the base. The reinforcing plates 540'/540'' is in contact with or is fixed to the base 100. The reinforcing plates 540'/540'', embedded below the opening 320''''/320'''' of the plastic part 300''''/300'''', can reduce occurrence of sink marks of the flexible base 100 when molding the plastic parts 300''''/300'''', reduce occurrence of irregularities of the base 100 when molding the plastic parts 300''''/300'''', compensate reduction in strength of the plastic part 300''''/300'''' due to its reduced thickness resulting from the formation of the opening 320''''/320'''', and/or reduce light leakage from the opening 320''''/320'''' of the plastic parts 300''''/300''''. The reinforcing plates 540'/540'' may be made of the same material as that for the engaging part 600.

Figure 11:
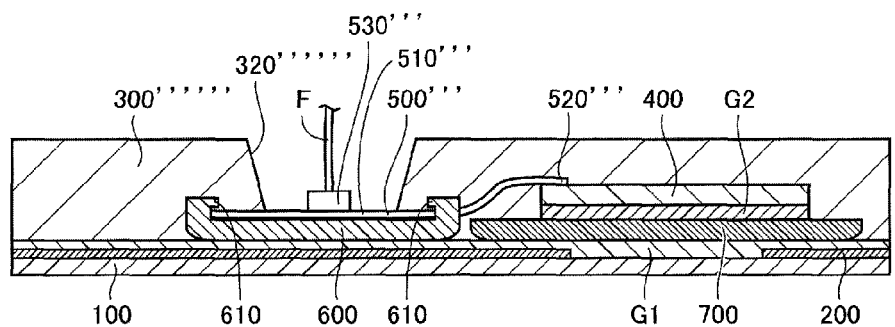
FIG. 11 is a schematic partial end view of a second design modification of the input device in accordance with the Third embodiment of the invention.
Figure 12:
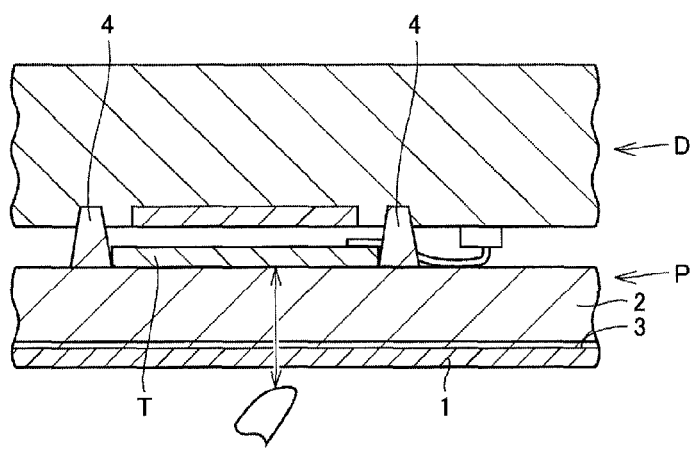
FIG. 12 is a schematic partial end view of a conventional input device.

In the First to Fourth embodiments, the connecting part 500 is engaged with one of the pair of engaging pieces 610 of the engaging part 600. However, as shown in FIG. 11, a first end 510''' of the connecting part 500''' may be engaged with the pair of engaging pieces 610 of the engaging part 600. Further, an external connecting portion 530''' such as a B-to-B connector may be provided on the first end 510''' of the connecting portion 500'''. The external connecting portion 530''' may be exposed from an opening 320'''''' of a plastic part 300''''''. In this case, the external connecting portion 530''' is connectable to a flexible printed circuit board F connected to the circuit board of an electronic device.

The engaging part described above is configured such that as engaged with the connecting part, its periphery is embedded in the plastic part, and its central portion is exposed from the second opening of the plastic part. However, the engaging part of the invention may be modified in any manner as long as it is partially embedded in the plastic part, partially exposed from the second opening of the plastic part, and engageable with the connecting part. For example, the engaging part may be modified so as not to be in contact with the base. It is possible to appropriately select the outer shape and/or material of the engaging part, which hardly causes irregularities of the base having flexibility due to its outer shape when molding the plastic part. For example, the engaging part may have all of the edges on the side of the base in curved forms. Also, the engaging part may be made of material in the same group as that of the material for the base (for example, plastic material in the same group as that of the material for the base: e.g. polycarbonate (PC) or polymethylmethacrylate (PMMA) corresponding to the base 100 of the above embodiments). The engaging part may also be made of an elastic material.

The spacer may be any member to be embedded in the plastic part so as to be interposed between the base and the touch sensor. For example, in the case where the base is optically opaque, the spacer may be made of metal such as SUS. The spacer may have all of the edges on the side of the base in curved forms. However, the spacer is not limited to this. It is possible to appropriately select the outer shape and/or material of the spacer, which hardly causes irregularities on a flexible base when molding of the plastic part. For example, all of the edges of the spacer on the side of the base may be in curved form. Also, the spacer may be made of material in the same group as that of the material for the base (for example, plastic material in the same group as that of the material for the base: e.g. polycarbonate (PC) or polymethylmethacrylate (PMMA) corresponding to the base 100 of the above embodiments). The spacer may also be made of an elastic material.

The base as described above is optically transparent and flexible. However, the base of the invention is not limited to this. The base may be configured to be translucent and flexible, or optically opaque and flexible, or translucent and nonflexible, or optically opaque and nonflexible. Further, the base may be made of a material that will not harden (will not lose its flexibility) after molding the plastic part. The ornamental layer may be provided on the inner face of the base as described above or may be omitted. Further, the ornamental layer may be formed entirely on the inner face of the base to make the base opaque. The bonding layer G1 and/or the adhesive layer G2 may be omitted.

It should be appreciated that the above-described preferred embodiments and modifications are described by way of examples only. The material, shape, dimensions, number, arrangement, and other features of each constituent element of the input device may be modified as long as they provide the same functions. At least one of the base, the plastic part, and the spacer may have translucency. The circuit board PB may be provided with, in place of the display such as an LCD, an illumination part such as a LED (light emitting diode) or an EL (electro-luminescence) device.

REFERENCE SIGNS LIST

100: base
200: ornamental layer
300: plastic part
310: ribbed part

320: opening (second opening)
300': plastic part
310': ribbed part
320': opening (second opening)
330': opening (first opening)
300": plastic part
400: touch sensor
500: connecting part
510: first end
520: second end
600: engaging part
610: engaging piece
700: spacer
710: edge (edge on the side of base)
720: edge (edge on the side of base)
730: edge (edge on the side of base)
800: circuit board
900: support

The invention claimed is:

1. An input device comprising:
a base, being a resin film and having an outer face and an inner face, the outer face including a touch sensing surface being touchable by a detection object;
a plastic part comprising hardened molded plastic material and being in direct contact, at least in part, with the inner face of the base; and
a touch sensor insert molded and substantially embedded within the plastic part,
wherein the base is in intimate contact with or integrated into the plastic part and is hardened,
wherein the base, plastic part, and touch sensor all substantially extend in a horizontal direction,
wherein an axis perpendicular to the horizontal direction exists, such that the axis passes through, in order, the base, the touch sensor, and the plastic part, or alternatively such that the axis passes though, in order, the base, the plastic part, and the touch sensor, and
wherein a distance between the touch sensor and the touch sensing surface is substantially constant.

2. The input device according to claim 1, wherein the touch sensor is disposed on the base.

3. The input device according to claim 2, wherein the plastic part includes a first opening provided on an opposite side of the touch sensor from the base.

4. The input device according to claim 1, wherein the touch sensor is insert molded in the plastic part in spaced relation to the base.

5. The input device according to claim 4, wherein the plastic part includes a first opening provided on an opposite side of the touch sensor from the base.

6. The input device according to claim 1, further comprising a spacer, the spacer being disposed on the base,
wherein the touch sensor is disposed on the spacer, and
wherein the spacer and the touch sensor are insert molded in the plastic part.

7. The input device according to claim 6, wherein all edges of the spacer on a side of the base are in curved form.

8. The input device according to claim 6, wherein the spacer is made of material in a same group as that of the material for the base or of an elastic material.

9. The input device according to claim 6, wherein the plastic part includes a first opening provided on an opposite side of the touch sensor from the spacer.

10. The input device according to claim 6, wherein at least one of the base, the plastic part, and the spacer has translucency.

11. The input device according to claim 1, wherein the plastic part includes a first opening provided on an opposite side of the touch sensor from the base.

12. The input device according to claim 1, further comprising a connecting part connected to the touch sensor and embedded in the plastic part, wherein
the connecting part includes an external connecting portion, and
the plastic part includes a second opening that exposes at least the external connecting portion.

13. The input device according to claim 12, further comprising an engaging part being partially embedded in the plastic part, partially exposed from the second opening of the plastic part, and engaged with the connecting part.

14. The input device according to claim 1, further comprising a connecting part connected to the touch sensor and embedded in the plastic part, wherein
the connecting part includes a first end, and
the plastic part includes a second opening that exposes at least the first end.

15. The input device according to claim 14, further comprising an engaging part being partially embedded in the plastic part, partially exposed from the second opening of the plastic part, and engaged with the connecting part.

16. The input device according to claim 1, further comprising a connecting part connected to the touch sensor and embedded in the plastic part, wherein
the connecting part includes a first end protruding from the plastic part.

17. The input device according to claim 1, wherein at least one of the base and the plastic part has translucency.

18. The input device according to claim 1, wherein
the base has translucency, and
the input device further includes an ornamental layer provided, in part, between the base and the plastic part.

19. The input device according to claim 1, further comprising:
a circuit board embedded in the plastic part; and
a connecting part embedded in the plastic part for connecting the touch sensor to the circuit board.

20. The input device according to claim 1, further comprising an intermediate layer substantially extending in the horizontal direction, in part, between the base and the plastic part and directly contacting the base and the plastic part.

21. The input device according to claim 1, wherein the base is a single resin layer.

22. An input device comprising:
a base being a resin film and having an outer face and an inner face, the outer face including a touch sensing surface being touchable by a detection object, the touch sensing surface including a curved surface;
a plastic part comprising hardened molded plastic material and being in direct contact, at least in part, with the inner face of the base; and
a touch sensor insert molded and substantially embedded within the plastic part such that the touch sensor curves such that a distance between the touch sensor and the touch sensing surface is generally substantially constant,
wherein the base is in intimate contact with or integrated into the plastic part and is hardened.

23. The input device according to claim 22, wherein the touch sensor is disposed on the inner face of the base.

24. The input device according to claim 22, wherein the touch sensor is insert molded in the plastic part such that the touch sensor curves in spaced relation to the base such that a distance between the touch sensor and the touch sensing surface is generally constant.

25. The input device according to claim 22, further comprising a spacer, wherein
the spacer is disposed on the inner face of the base,
the touch sensor is disposed on the spacer, and
the spacer and the touch sensor curve such as to conform to the touch sensing surface and such that a distance between the touch sensor and the touch sensing surface is generally constant, and
the spacer and the touch sensor are insert molded in the plastic part.

26. The input device according to claim 22, further comprising an intermediate layer extending, in part, between the base and the plastic part and directly contacting the base and the plastic part.

27. The input device according to claim 22, wherein the base is a single resin layer.

* * * * *